United States Patent
Kiyoyama et al.

(10) Patent No.: US 6,174,643 B1
(45) Date of Patent: Jan. 16, 2001

(54) PROCESS FOR DEVELOPING LITHOGRAPHIC PRINTING PLATE

(75) Inventors: Hideo Kiyoyama; Kimihisa Hamazoe; Toshiro Kondo, all of Tokyo (JP)

(73) Assignee: Mitsubishi Paper Mills Limited, Tokyo (JP)

( * ) Notice: Under 35 U.S.C. 154(b), the term of this patent shall be extended for 0 days.

(21) Appl. No.: 09/275,447

(22) Filed: Mar. 24, 1999

(30) Foreign Application Priority Data

Mar. 25, 1998 (JP) .................................................. 10-077239
Jan. 18, 1999 (JP) .................................................. 11-009157

(51) Int. Cl.$^7$ ................................ G03F 7/07; G03C 8/36; G03C 8/06; G03C 8/28
(52) U.S. Cl. ........................... 430/204; 430/249; 430/251
(58) Field of Search .................................... 430/204, 249, 430/251

(56) References Cited

U.S. PATENT DOCUMENTS

| | | | |
|---|---|---|---|
| 3,728,114 | 4/1973 | Futaki et al. | 430/204 |
| 4,425,420 | 1/1984 | De Jaeger et al. | 430/204 |
| 4,567,131 | 1/1986 | Watkiss | 430/204 |
| 5,068,165 | 11/1991 | Coppens et al. | 430/204 |
| 5,200,294 | 4/1993 | De Keyser et al. | 430/204 |
| 5,213,943 | 5/1993 | Coppens et al. | 430/204 |
| 5,273,858 | 12/1993 | Coppens et al. | 430/204 |
| 5,362,602 | 11/1994 | Coppens et al. | 430/204 |
| 5,405,730 | 4/1995 | Coppens et al. | 430/204 |
| 5,427,889 | 6/1995 | Saikawa et al. | 430/204 |
| 5,677,105 | * 10/1997 | Van Rompuy et al. | 430/204 |
| 5,693,448 | 12/1997 | Coppens et al. | 430/204 |

* cited by examiner

*Primary Examiner*—Richard L. Schilling
(74) *Attorney, Agent, or Firm*—Pillsbury Madison & Sutro LLP

(57) ABSTRACT

It is disclosed a process for developing a lithographic printing material having physical development nuclei between an aluminum support and a silver halide emulsion layer containing 95 mole % or more of silver chloride based on the total amount of the silver halide, when development of the lithographic printing material is carried out by using a developing solution having a pH of 13.0 at a development temperature of 25° C. and a development time of 40 seconds, a decreased amount of aluminum oxide in the aluminum support is 0.8 g or more per 1 $m^2$ of the support, the improvement wherein the process for developing a lithographic printing plate comprises subjecting to development so as to control the decreased amount of the aluminum oxide being 0.6 g or less per 1 $m^2$ by adjusting at least one of the pH of the developing solution, the development temperature and the developing time.

14 Claims, No Drawings

PROCESS FOR DEVELOPING LITHOGRAPHIC PRINTING PLATE

BACKGROUND OF THE INVENTION

1. Field of the Invention

This invention relates to a process for developing a lithographic printing plate using an aluminum plate as a support and utilizing a silver complex salt diffusion transfer process.

2. Prior Art

Some examples of a lithographic printing plate using the silver complex diffusion transfer process (the DTR process) are described on pages 101 to 130 of André Rott and Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two-sheet type lithographic printing plate is described in detail in Japanese Provisional Patent Publication No. 158844/1982. Also, the mono-sheet type one is described in detail in U.S. Pat. No. 3,728,114, Japanese Patent Publications No. 30562/1973 and No. 15765/1976, and Japanese Provisional Patent Publications No. 111103/1976 and No. 150105/1977.

The mono-sheet type lithographic printing plate utilizing the silver complex diffusion transfer process with the use of an aluminum plate as a support (hereinafter referred to as "an aluminum lithographic printing plate") is described in detail in Japanese Provisional Patent Publications No. 118244/1982, No. 158844/1982, No. 260491/1988, No. 116151/1991 and No. 282295/1992, and U.S. Pat. Nos. 4,567,131 and No. 5,427,889.

In the above-mentioned aluminum lithographic printing plate, physical development nuclei are carried on a roughened and anodized aluminum support, and a silver halide emulsion layer which is substantially not cured is further provided thereon. A general process for making this lithographic printing plate comprises the steps of exposure, DTR development processing, water washing processing (washing off: removal of a silver halide emulsion layer with washing solution, hereinafter merely referred to as "washing processing") and finishing processing.

In detail, a metal silver image portion is formed on the a physical development nuclei by the development processing and the silver halide emulsion layer is removed by the subsequent washing processing to expose the metal silver image portion (hereinafter referred to as a "silver image portion"). Simultaneously, the anodized aluminum surface itself is exposed as a non-image portion.

After the washing processing, a finishing solution containing a protective colloid such as gum arabic, dextrin, carboxymethyl cellulose, polystyrenesulfonic acid, etc. is coated on the exposed silver image portion and the non-image portion for protecting the same. A processing of the so-called gum coating is applied to the surface of the plate. The finishing solution is also called as a fixing solution and it is general that it contains a compound which makes the silver image portion oleophilic such as a nitrogen-containing heterocyclic compound having a mercapto group or a thione group (hereinafter referred to as an "oleophilic agent").

In the aluminum lithographic printing plate, as described, for example, in Japanese Provisional Patent Publications No. 260491/1988, No. 116151/1991, etc., there is a problem that an electromotive force exists between the aluminum plate and the silver halide emulsion and causes corrosion at the silver image region by being developed by a developing solution having a high pH of 13 or so whereby pin-hole state spots which are so-called etch pits are caused. It has been known that this etch pit is likely caused when a silver halide emulsion with a high silver chloride content is used. The silver halide emulsion with a high silver chloride content has an advantage as compared with a silver halide emulsion with a high silver bromide content that it has a rapid DTR developing speed. An aluminum lithographic printing plate without etch pit has been desired to be developed while maintaining the so above advantage.

On the other hand, a plate making treatment is carried out by a processor (an automatic developer). In the processor, a developing step, a washing step, a finishing step and a drying step are provided, and a heater for controlling the temperature is generally provided at the developing step. With regard to the temperature of the developing solution, it is generally advantageous to set the temperature relatively high for controlling the temperature, assuming the high temperature at the summer season, has been carried out, for example, at 25° C. as described in Example of Japanese Provisional Patent Publication No. 116151/1991. However, the temperature is set too high, there is a problem that the printing endurance is markedly decreased. Also, the number of etch pit caused is also increased. Accordingly, it has been desired to develop a processing process which can give a stable printing characteristic within the temperature range of 20° C. to 30° C.

Also, with regard to the developing time (a time from immersing the lithographic printing plate into a developing solution in a developing tank to the time of removing the silver halide emulsion layer at the next washing step), for example, in Japanese Provisional Patent Publications No. 116151/1991, No. 220763/1996, etc., it is disclosed that the development for 40 seconds in total is carried out including 8 to 10 seconds of immersing development in a developing solution and thereafter 30 seconds of diffusion transfer development in a system other than the developing solution. However, in general, when the development time exceeds a certain period, there is a problem that a printing endurance is lowered.

In U.S. Pat. No. 5,427,889, a DTR lithographic printing plate using an aluminum support having 500 or more of pits with a diameter of 0.03 to 0.30 $\mu$m per 100 square $\mu$m and an average diameter of the pits of 0.05 to 0.20 $\mu$m. Moreover, in U.S. Pat. No. 5,405,730, a DTR lithographic printing plate using an aluminum support in which the total surface area of the depressed area is 50% or more based on the total surface area and the depressed area has a continuous depth of at least 0.5 $\mu$m. However, even when these aluminum supports are used, their merits cannot sufficiently be utilized, and the above-mentioned problems are still retained.

Also, in DTR development of the lithographic printing plate at which the present invention is aimed, a thiosulfate is generally used as a solvent for the silver halide. However, the thiosulfate involves the problem of poor stability in an alkaline solution whereby decrease in the printing endurance due to running processing, etc. is caused Also, a waste solution (containing silver thiosulfate) after use of the developing solution which contains the thiosulfate will become a material to be regulated by a Law so that there is a problem that the waste must be controlled.

SUMMARY OF THE INVENTION

An object of the present invention is to provide a process for developing an aluminum lithographic printing plate having a stable high printing endurance at a development temperature of 20° C. to 30° C. for a relatively short development time, generation of etch pit is restrained and the printing endurance is not lowered by a running processing of the developing solution. Another object of the present invention is to provide a process for developing an aluminum lithographic printing plate which does not use any thiosulfate and involves no environmental problem.

The above-mentioned objects of the present invention can be accomplished, in a process for developing a lithographic printing material having physical development nuclei between an aluminum support and a silver halide emulsion layer containing 95 mole % or more of silver chloride based on the total amount of the silver halide, when development of the lithographic printing material is carried out by using a developing solution having a pH of 13.0 at a development temperature of 25° C. and a development time of 40 seconds, a decreased amount of aluminum oxide in the aluminum support is 0.8 g or more per 1 $m^2$ of the support, the improvement wherein the process for developing a lithographic printing plate comprises subjecting to development so as to control the decreased amount of said aluminum oxide being 0.6 g or less per 1 $m^2$ by adjusting at least one of the pH of the developing solution, the development temperature and the developing time.

DESCRIPTION OF THE PREFERRED EMBODIMENTS

According to the preferred embodiments of the present invention, a lithographic printing material having physical development nuclei between an aluminum support and a silver halide emulsion layer containing 95 mole % or more of silver chloride based on the total amount of the silver halide, in which a decreased amount of aluminum oxide in the aluminum support is 0.8 g or more per 1 $m^2$ when development is carried out by a developing solution having a pH of 13.0, at a development temperature of 25° C. and a development time of 40 seconds, is subjected to a developing processing which comprises subjecting the lithographic printing material to the development so as to become the decreased amount of said aluminum oxide in the aluminum support being 0.1 to 0.6 g per 1 $m^2$ by optionally combining the development conditions within the range of the pH of the developing solution at 12.8 or lower, the developing temperature of 20° C. to 30° C. and the developing time of 30 seconds or shorter.

In the following, the present invention is explained in detail. The silver halide to be used in the silver halide emulsion layer of the present invention contains 95 mole % or more of silver chloride, preferably 98 mole % or more. The content of silver iodide is preferably 0 to 2 mole %, more preferably 0.1 to 1.0 mole %. When silver iodide is to be contained, it is particularly preferred that after formation of silver chloride particles is completed, a water-soluble iodide is added to convert the surface silver chloride particles with silver iodide. An average particle size of the silver halide particles is preferably 0.1 to 0.6 $\mu$m. The silver halide emulsion can be produced by the method known in this field of the art, and a metal salt such as a rhodium salt or an iridium salt may be used. The silver halide emulsion is preferably a negative type one, which is not fogged. These silver halide emulsions can be subjected to chemical sensitization or spectral sensitization, depending on necessity. It is particularly preferred to use a sensitizing dye having a spectral absorption at 600 to 700 nm for scanning type exposure (helium-neon laser, red LED, etc.) of a red light source.

As the hydrophilic colloid of the silver halide emulsion layer, gelatin is preferably used for preparing silver halide particles. As the gelatin, there may be used various gelatins such as acid-treated gelatin and alkalitreated gelatin. Also, modified gelatins thereof (e.g., phthalated gelatin and amidated gelatin) can be used. Further, a hydrophilic high molecular weight compound such as polyvinyl pyrrolidone, various starches, albumin, polyvinyl alcohol, gum arabic and hydroxyethyl cellulose can be contained. As the hydrophilic colloid to be used, a hydrophilic colloid substantially containing no hardener is desirably used in order to facilitate peeling of the silver halide emulsion layer after development.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and preparation process thereof, reference can be made to, for example, Andre Rott and Edith Weyde, "Photographic Silver Halide Diffusion Processes", published by the Focal Press, London and New York (1972).

In the present invention, between the physical development nuclei layer and the silver halide emulsion layer, a water-swelling intermediate layer as described in Japanese Provisional Patent Publication No. 116151/1991 or an intermediate layer containing hydrophobic polymer beads as described in Japanese Provisional Patent Publication No. 282295/1992 may be provided.

In the process for developing the lithographic plate of the present invention, development conditions are so adjusted to control the decreased amount of aluminum oxide in the aluminum support by dissolving in the developing process (during the period from immersing the lithographic printing plate in the developing solution in the developing tank to the time of removing the silver halide emulsion layer in the next washing step). In Japanese Provisional Patent Publication No. 260491/1988, as a support of an aluminum lithographic printing plate using the DTR process, it is disclosed that a ratio of an amount of aluminum oxide to the surface roughness (Ra) is preferably made large for preventing from occurrence of etch pit. However, even when an amount of aluminum oxide per unit area is made large by the anodizing treatment, the above-mentioned various problems of the prior art are not solved In the present invention, it is important to restrain or control a decreased amount of aluminum oxide by dissolution with the development conditions irrespective of the amount of aluminum oxide contained in the aluminum support. As the aluminum support of the aluminum lithographic printing plate to be used in the present invention, those containing 1.5 g or more per 1 $m^2$ of porous aluminum oxide, preferably 1.8 g to 5 g of the same per 1 $m^2$ are preferably used.

In the present invention, it is particularly preferred to use the aluminum support having 500 or more (preferably 1,000 or more) of pits having a diameter of 0.03 to 0.30 $\mu$m per 100 square pi and an average diameter of these pits of 0.05 to 0.20 $\mu$m (preferably 0.05 to 0.15 $\mu$m) as described in U.S.

Pat. No. 5,427,889 or the aluminum support in which the total surface area of the depressed area is 50% or more based on the total surface area and the depressed area has a continuous depth of at least 0.5 μm as described in U.S. Pat. No. 5,405,730.

A precondition of the present invention is applied to the case where a decreased amount of aluminum oxide in the aluminum support is 0.8 g or more per 1 m² when development is carried out by using a developing solution having a pH of 13.0, at a development temperature of 25° C. and a development time of 40 seconds. Under such development processing conditions, in many cases, the decreased amount of aluminum oxide is 1 g or so per 1 m².

In the present invention, when the development processing is carried out, the conditions that an amount of aluminum oxide decreased by dissolution during development becomes 0.6 g or less, preferably 0.5 g or less, particularly preferably 0.3 g to 0.1 g per 1 m² shall be selected.

In the present invention, as a means for restraining dissolution of aluminum oxide, at least one of the pH of the developing solution, the development time and the development temperature is selected. The pH of the developing solution is preferably low, the development time is preferably short and the development temperature is preferably low. However, when all of the three parameters are combined with the most preferred conditions, DTR development itself becomes insufficient. Thus, the conditions are determined by optionally combining each of the preferred conditions in view of the DTR development characteristics under these conditions. Particularly important parameter is the pH of the developing solution. More specifically, the pH of the developing solution is preferably 12.8 or less, particularly preferably in the range of 12.7 to 11.5, and the development time is preferably 30 seconds or shorter, particularly preferably 10 to 25 seconds. The temperature of the developing solution is preferably 15 to 35° C., particularly preferably in the range of 20 to 30° C.

The measurement of the total aluminum content can be carried out according to JIS-H-8680-7 "Film weight method" in which an amount of aluminum oxide is measured by dissolving with a bichromic acid aqueous solution. In the present invention, the measurement of the decreased amount of aluminum oxide is carried out by removing light-sensitive layers of an aluminum lithographic printing material with a warm water, etc. to prepare an aluminum support and scraping aluminum oxide at the back surface of the support and weighing the total weight (a) of the support. Then, the support is subjected to development and plate-making treatment, dried, and the total weight (b) of the support is weighed. The difference (a–b) of the weight is made an amount of aluminum oxide dissolved by the developing treatment.

In the present invention, the development time is defined as a time during from contacting the light-sensitive surface with a developing solution to a time when the light-sensitive surface is removed by a washing solution. Between the developing treatment and the washing treatment, treatments of neutralization and stabilization may be applied. The terminal point of the development time in this case is the time at which the light-sensitive surface contacts with a neutralization solution.

The developing treatment is generally carried out by using the method in which a printing plate is immersing in a developing solution charged in a developing tank, but may be carried out by spraying or coating a developing solution onto the printing plate.

The developing solution to be used in the present invention may contain additives including a developing agent such as a polyhydroxybenzene or a 3-pyrazolidinone; an alkaline substance such as potassium hydroxide, sodium hydroxide, lithium hydroxide, sodium tertiary phosphate or an amine compound; a preservative such as sodium sulfite; a viscosity modifier such as carboxymethyl cellulose; an antifoggant such as potassium bromide; a development modifier such as a polyoxyalkylene compound; a silver halide solvent such as a compound as mentioned below.

In the present invention, in order to stabilize the treatments and to solve the problem for controlling a waste solution, it is preferred not to use a thiosulfate as a silver halide solvent. Accordingly, the silver halide solvent to be used in the present invention may include, for example, a sulfite such as sodium sulfite and potassium hydrogen sulfite; an iodide such as potassium iodide and sodium iodide; 2-mercaptobenzoic acid and derivatives thereof; a cyclic imide such as uracil; an alkanolamine; a diamine; a mesoionic compound; and a thioether as described in U.S. Pat. No. 5,200,294, etc. Among these silver halide emulsions, an alkanolamine, a mesoionic compound and a thioether compound are particularly preferred. As the alkanolamine, there may be mentioned, for example, 2-(2-aminoethylamino) ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, 2-methylaminoethanol, 2-amino-2-methyl-1-propanol and the like. An amount of the alkanolamine to be added is preferably 1 to 100 g, more preferably 5 to 50 g per liter of the developing solution.

The mesoionic compound to be used in the present invention is a compound represented by the following formula (I):

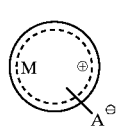

(I)

wherein M represents a heterocyclic compound containing atoms selected from the group consisting of a carbon atom, a nitrogen atom, an oxygen atom, a sulfur atom and selenium atom, and containing at least one of 5-membered or 6-membered ring in the structure; and A⁻ represents —O⁻, —S⁻ or —N⁻—R, where R represents an alkyl group preferably having 6 or less carbon atoms, a cycloalkyl group preferably having 3 to 6 carbon atoms, an alkenyl group preferably having 2 to 6 carbon atoms, an alkynyl group preferably having 2 to 6 carbon atoms, an aralkyl group, an aryl group preferably having 6 to 12 carbon atoms or a heterocyclic ring group preferably having 6 or less carbon atoms. Examples of the heterocyclic ring represented by M may include an imidazolium ring, a pyrazolium ring, an oxazolium ring, an isoxazolium ring, a thiazolium ring, an isothiazolium ring, a 1,3-dithiol ring, a 1,3,4-oxadizaolium ring, a 1,2,3-oxadiazolium ring, a 1,3,2-oxadiazolium ring, a 1,2,3-triazolium ring, a 1,3,4-triazolium ring, a 1,3,4-thiadiazolium ring, a 1,2,3-thiadiazolium ring, a 1,2,4-thiadiazolium ring, a 1,2,3,4-oxatriazolium ring, a 1,2,3,4-tetrazolium ring, 1,2,3,4-thiatriazolium ring, and the like.

In the mesoionic compounds to be used in the present invention, the compounds represented by the formula (II) and the formula (III) are preferred.

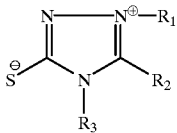
(II)

wherein $R_1$ and $R_3$ may be the same or different and each represents an alkyl group, a cycloalkyl group, an alkenyl group, an alkynyl group, an aralkyl group, an aryl group or a heterocyclic ring group; and $R_2$ represents a hydrogen atom, an alkyl group, a cycloalkyl group, an alkenyl group, an alkynyl group, an aralkyl group, an aryl group or a heterocyclic ring group; or $R_1$ and $R_2$ or $R_2$ and $R_3$ may be bonded to form a ring.

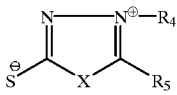
(II)

wherein X represents S or O; $R_4$ and $R_5$ may be the same or different and each represents an alkyl group, a cycloalkyl group, an alkenyl group, an alkynyl group, an aralkyl group, an aryl group, a heterocyclic ring group or a dialkylamino group.

Specific examples of the compound represented by the formula (II) to be used in the present invention may include those as described in Japanese Provisional Patent Publication No. 324448/1992 and may be mentioned by the following (II-1) to (II-11) but the present invention is not limited by these as a matter of course.

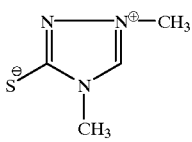
(II-1)

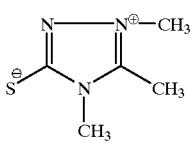
(II-2)

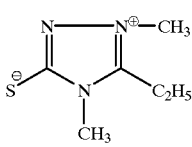
(II-3)

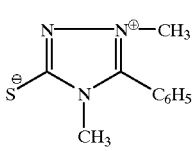
(II-4)

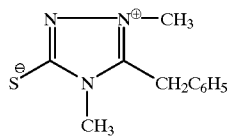
(II-5)

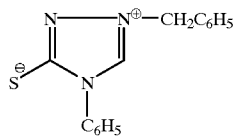
(II-6)

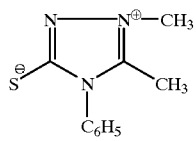
(II-7)

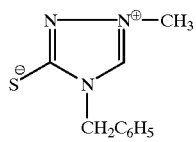
(II-8)

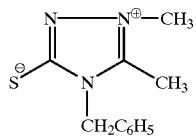
(II-9)

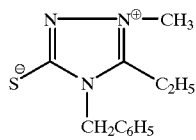
(II-10)

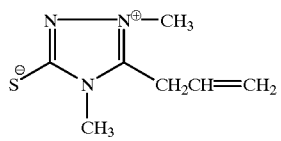
(II-11)

Specific examples of the compound represented by the formula (III) to be used in the present invention may include those as described in Japanese Provisional Patent Publication No. 328559/1992 and may be mentioned by the following (III-1) to (III-14) but the present invention is not limited by these as a matter of course.

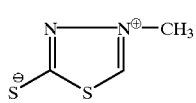
(III-1)

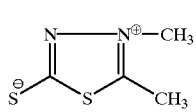
(III-2)

-continued

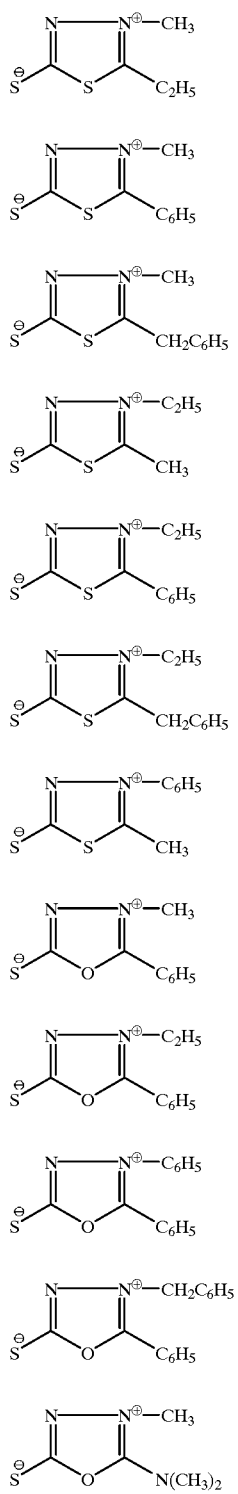

(III-3)
(III-4)
(III-5)
(III-6)
(III-7)
(III-8)
(III-9)
(III-10)
(III-11)
(III-12)
(III-13)
(III-14)

An amount of the compound represented by the formula (II) or (III) to be used in the present invention may vary depending on the various conditions, but it is generally 0.1 g to 10 g, more preferably in the range of 0.1 g to 5 g per liter of the developing solution.

The thioether to be used in the present invention is represented by the following formula (IV):

$$R_6—(S—R_8)_m—S—R_7 \quad \text{(IV)}$$

wherein $R_6$ and $R_7$ may be the same or different from each other and each represents an alkyl group preferably having 1 to 5 carbon atoms, or $R_6$ and $R_7$ may be bonded to form a ring, and these alkyl groups may be substituted by an amino group, an amide group, an ammonium group, a hydroxyl group, a sulfo group, a carboxyl group, an aminocarbonyl group or an aminosulfonyl group; and $R_8$ represents an alkylene group in which other divalent group may be interposed between alkylene groups; m is 0 or an integer of 1 to 4, and when m is 2 or more, each $R_8$ may be the same or different from each other.

Specific examples of the thioether compound to be used in the present invention are shown below.

$HO(CH_2)_2S(CH_2)_2OH$ (IV-1)

$CH_3SCH_2\underset{NH_2}{\overset{|}{C}H}COOH$ (IV-2)

$HO(CH_2)_2S(CH_2)_2N(CH_3)_2$ (IV-3)

$CH_3S(CH_2)_2CH(NH_2)COOH$ (IV-4)

$HO(CH_2)_2SCH_2H(CH_2)_2OH$ (IV-5)

$HO(CH_2)_2S(CH_2)_2S(CH_2)_2OH$ (IV-6)

$HO(CH_2)_2S(CH_2)_3S(CH_2)_2OH$ (IV-7)

$C_2H_5S(CH_2)_2SCH_2CHOHCH_2OH$ (IV-8)

$HOOCCH_2SCH_{22}SCH_2COOH$ (IV-9)

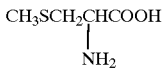

(IV-10)

$HO(CH_2)_3S(CH_2)_2S(CH_2)_3OH$ (IV-11)

$HOOCCH_2S(CH_2)_2SCH_2COOH$ (IV-12)

$HO(CH_2)_2S(CH_2)_4S(CH_2)_2OH$ (IV-13)

$HOOCCH_2S(CH_2)_3SCH_2COOH$ (IV-14)

$HOOC(CH_2)_2SCH_2S(CH_2)_2COOH$ (IV-15)

$(HO(CH_2)_2S(CH_2)_2)_2O$ (IV-16)

$H_2NCO(CH_2)_2S(CH_2)_2S(CH_2)_2CONH_2$ (IV-17)

$HOOC(CH_2)_2S(CH_2)_2S(CH_2)_2COOH$ (IV-18)

$(HOCH_2CHOHCH_2SCH_2)_2$ (IV-19)

$HOOC(CH_2)_2S(CH_2)_3S(CH_2)_2COOH$ (IV-20)

-continued $C_2H_5S(CH_2)_2NHCO(CH_2)_2COOH$ (IV-21)

$HO(CH_2)_3S(CH_2)_2O(CH_2)_3O(CH_2)_2S(CH_2)_2OH$ (IV-22)

$HO(CH_2)_6S(CH_2)_5S(CH_2)_6OH$ (IV-23)

An amount of the thioether compound as mentioned above is generally 0.01 g to 20 g, more preferably in the range of 0.1 g to 10 g per liter of the developing solution.

The above-mentioned silver halide solvents may be used in combination of two or more.

It is preferred to further contain a compound (an oleophilic agent) in the developing solution of the present invention to make the silver image portion oleophilic. As the oleophilic agent to be used in the present invention, there may be mentioned a compound described on pages 105 to 106 of Andre Rott and Edith Weyde, "Photographic Silver Halide Diffusion Processes", published by the Focal Press, London and New York (1972). For example, there may be mentioned a compound having a mercapto group or a thione group, a quaternary ammonium compound and the like, and in the present invention, a compound having a mercapto group or a thione group is particularly preferably used. Particularly preferably a nitrogen-containing heterocyclic compound having a mercapto group or a thione group, and they are described, for example, in Japanese Patent Publication No. 29723/1973 and Japanese Provisional Patent Publication No. 127928/1983. In the following, specific examples thereof are enumerated but the present invention is not limited by these.

Specific examples of such a compound may include 2-mercapto-4-phenylimidazole, 2-mercapto-1-benzylimidazole, 2-mercapto-benzimidazole, 1-ethyl-2-mercapto-benzimidazole, 2-mercapto-1-butyl-benzimidazole, 1,3-diethyl-benzoimidazolin-2-thione, 1,3-dibenzyl-imidazolidin-2-thione, 2,2'-dimercapto-1,1'-decamethylene-diimidazoline, 2-mercapto-4-phenylthiazole, 2-mercapto-benzothiazole, 2-mercatonaphthothiazole, 3-ethyl-benzothiazolin-2-thione, 3-dodecyl-benzothiazolin-2-thione, 2-mercapto-4,5-diphenyloxazole, 2-mercaptobenzoxazole, 3-pentyl-benzoxazolin-2-thione, 1-phenyl-3-methylpyrazolin-5-thione, 3-mercapto-4-allyl-5-pentadecyl-1,2,4-triazole, 3-mercapto-5-nonyl-1,2,4-triazole, 3-mercapto-4-acetamido-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 2-heptadecyl-5-phenyl-1,3,4-oxadiazole, 5-mercapto-1-phenyl-tetrazole, 2-mercapto-5-nitropyridine, 1-methyl-quinolin-2(1H)-thione, 3-mercapto-4-methyl-6-phenyl-pyridazine, 2-mercapto-5,6-diphenyl-pyrazine, 2-mercapto-4,6-diphenyl-1,3,5-triazine, 2-amino-4-mercapto-6-benzyl-1,3,5-triazine, 1,5-dimercapto-3,7-diphenyl-S-triazolino[1,2-a]-S-triazoline, etc.

An amount of the above-mentioned oleophilic agent to be added to the developing solution is preferably 0.01 to 10 g/liter.

In the present invention, a washing treatment is applied to subsequent to the developing treatment. The washing solution may contain a buffer for buffering the solution at a pH of 4 to 8, preferably in the range of 4.5 to 7 such as a phosphate buffer, a citrate buffer or a mixture of them. Also, the washing solution may contain a preservative. To the washing solution, a proteinase or the above-mentioned oleophilic agent may be further. As the proteinase, there may be mentioned, for example, pepsin, rennin, trypsin, chymotrypsin, cathepsin, papain, ficin, thrombin, renin, collagenase, bromelain and bacterioproteinase. An amount of the enzyme to be added to the processing solution is preferably about 0.5 to 50 g/liter.

Between the developing treatment and the washing treatment, a neutralization-stabilization treatment to stop the progress of the development may be applied. In the neutralizing solution, the above-mentioned oleophilic agent may be contained.

The above washing solution is used to completely wash off the silver halide emulsion layer(s) on the aluminum support. A method of spraying the washing solution at 25 to 35° C. with the jet system, or a method of peeling the emulsion layer(s) by a scrub roller while spraying the washing solution is generally employed.

In the aluminum lithographic printing plate, removal of the silver halide emulsion layer(s) by washing is an extremely important step for completely exposing the silver image portion and the non-image portion constituted by the aluminum surface itself. In particular, the silver image portion which accepts an ink is required to be strongly oleophilic, and any substance which prohibits oleophilic property such as gelatin on the surface thereof shall be completely removed.

The silver image portion and the non-image portion exposed by the washing treatment is subjected to a treatment by the finishing solution for the purpose of heightening oleophilicity and hydrophilicity of the respective portions and for protecting the plate surface. In the present invention, the finishing solution preferably contains a protective colloid such as gum arabic, dextrin, sodium alginate, alginic acid propylene glycol ester, hydroxyethyl starch, carboxymethyl cellulose, hydroxyethyl cellulose, polyvinyl pyrrolidone, polystyrene sulfonic acid, polyvinyl alcohol, etc. in order to protect and to improve hydrophilicity of the anodized layer at the nonimage portion. Also, in order to further improve oleophilicity of the image portion, the above-mentioned oleophilic agent is preferably contained. Moreover, the above-mentioned proteinase may be further contained.

EXAMPLES

In the following, the present invention is explained by referring to Examples by which the present invention is not limited.

Example 1

According to the method as disclosed in U.S. Pat. No. 5,427,889 which is incorporated as a reference herein, electrolytic roughening treatment and anodization of an aluminum plate were carried out to obtain an aluminum support having a thickness of 0.30 mm to which pits with a diameter of 0.03 to 0.30 $\mu$m had been formed with about 5,600 per 100 $\mu$m$^2$ on a plateau with an average diameter of about 5 $\mu$m, and the pit has an average diameter of 0.08 $\mu$m. This aluminum support was subjected to anodization after the surface roughening treatment, and had an amount of aluminum oxide of 2.5 g/m$^2$ and an average roughness (Ra) measured by JIS B 0601 (1994) of 0.5 to 0.6 $\mu$m.

On the aluminum support, a physical development nuclei solution comprising a sol solution of palladium sulfide containing a small amount of a binder was coated and then dried. An amount of palladium sulfide contained in a physical development nuclei layer was 3 mg/m$^2$.

<Preparation of Silver Halide Emulsion A>

As a protective colloid, alkali-treated gelatin was used. As a silver halide emulsion, a silver chlorobromide having an average particle size of 0.2 μm, with which 0.006 mmole of potassium hexachloroiridate (IV) per mole of silver was doped, was prepared by the control double jet method. Thereafter, by adding a potassium iodide aqueous solution to the silver chlorobromide to subject to conversion whereby a silver chloroiodobromide emulsion (AgCl: 79.6 mole %, AgBr: 20 mole %, and Conversion AgI: 0.4 mole %) was prepared. Further, the emulsion was then subjected to sulfur-gold sensitization, and then spectrally sensitized by using 3 mg of a sensitizing dye represented by the following formula (A) per 1 g of silver.

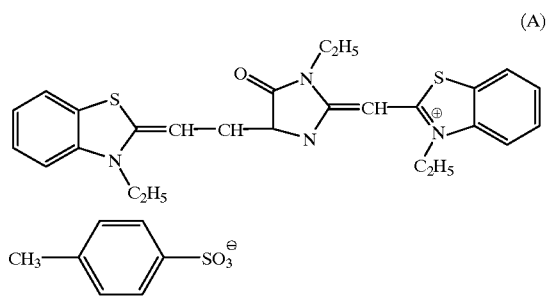

(A)

<Preparation of Silver Halide Emulsion B>

In the same manner as in the above-mentioned emulsion A except for using silver iodide (AgCl: 99.5 mole %, Conversion AgI: 0.5 mole %) as a silver halide, Silver halide emulsion B was prepared.

A surfactant was added to the thus prepared silver halide emulsion A or B, and the mixture was coated on the aluminum support on which the above-mentioned physical development nuclei had been coated, so that an amount of silver became 2.5 g/m² (a gelatin amount of 3 g/m²), followed by drying to obtain a lithographic printing material A (in which Silver halide emulsion A was used) and a lithographic printing material B (in which Silver halide emulsion B was used) was obtained.

On the thus prepared lithographic printing materials, an image was each outputted by an output machine having a red LD laser at 633 nm as a light source. Then, the lithographic printing materials were processed by a processor for plate making to obtain lithographic printing plates. The processor for plate making is constituted by a step of development processing, a step of washing processing (peeking an emulsion layer by a scrub roller while showering and jetting a washing solution), a step of finishing processing and a drying step. A developing solution, a washing solution and a finishing solution used in the processing are shown below.

<Developing Solution A>

| | |
|---|---|
| Sodium hydroxide | 20 g |
| Hydroquinone | 20 g |
| 1-Phenyl-3-pyrazolidinone | 2 g |
| Anhydrous sodium sulfite | 100 g |
| Sodium thiosulfate (pentahydrate) | 8 g |
| 2-Mercapto-5-n-heptyl-oxadiazole | 0.5 g |
| Ethylenediamine tetraacetate sodium salt | 5 g |
| Polyethylene glycol (Average molecular weight: 400) | 10 g |
| Make up to 1,000 ml with addition of water. A pH was adjusted to 13.0. | |

<Washing Solution>

| | |
|---|---|
| 2-Mercapto-5-n-heptyl-oxadiazole | 0.5 g |
| Triethanolamine | 13 g |
| Sodium bisulfite | 10 g |
| Potassium primary phosphate | 40 g |
| Make up to 1,000 ml with addition of water. A pH was adjusted to 6.0. | |

<Finishing Solution>

| | |
|---|---|
| Gum arabic | 10 g |
| Trypsin | 2 g |
| Potassium primary phosphate | 10 g |
| Make up to 1,000 ml with addition of water. A pH was adjusted to 6.0. | |

By using the developing solution A, the lithographic printing materials A and B were subjected to developing treatment at a developing solution temperature of 25° C. and a developing time of 40 seconds to make plates whereby the respective printing plate A-1 and the printing plate B-1 were prepared. The printing plate A-1 and the printing plate B-1 were both decreased in an amount of aluminum oxide by the developing treatment with each 1.3 g/m². With respect to these printing plates, printing was carried out by using a printer Heidelberg TOK (trade name, an offset printing press manufactured by Heidelberg Co.), an ink (New Champion Black H, trade name, produced by Dainippon Ink Co., Japan) and commercially available damping water for a PS plate, and printing endurance was evaluated. The printing endurance was evaluated by the number of sheets printed until 5% dot image was disappeared or a printed material with a good quality could not be obtained while continuing printing under the above-mentioned conditions. Also, etch pits generated in the printing plate after plate-making were also observed.

Printing endurance of the printing plate A-1 or the printing plate B-1 was both 10,000 sheets or less. Also, in both of the printing plates, significant etch pits were generated.

Next, a printing plate A-2 or a printing plate B-2 was prepared in the same manner as mentioned above except for subjecting to developing treatment at a developing solution temperature of 28° C. and a developing time of 20 seconds by using the developing solution A. The printing plate A-2 and the printing plate B-2 were both decreased in an amount of aluminum oxide by the developing treatment with the amount of each 0.9 g/m². With respect to these printing plates, printing was carried out in the same manner as mentioned above and printing endurance was evaluated. As a result, printing endurance of the printing plate A-2 or the printing plate B-2 was both 10,000 sheets or less. Also, in both of the printing plates, etch pits were generated.

Next, a pH of the developing solution A was adjusted by a phosphoric acid to 12.3 to prepare a developing solution B. By using the developing solution B, the lithographic printing materials A and B were subjected to developing treatment at a developing solution temperature of 25° C. and a developing time of 40 seconds, followed by the same procedure as mentioned above to prepare a printing plate A-3 and a printing plate B-3 (which is a sample of the present invention), respectively. The printing plate A-3 and the printing plate B-3 were both decreased in an amount of aluminum oxide by the developing treatment with the amount of each 0.5 g/m². With respect to these printing plates, printing was carried out in the same manner as mentioned above and printing endurance was evaluated. As a result, printing endurance of the printing plate A-3 was 30,000 sheets or less but that of the printing plate B-3 was 100,000 sheets or more. Also, in the printing plate B-3, substantially no etch pit was generated.

Example 2

By using the developing solution B prepared in Example 1, the lithographic printing materials A and B were subjected to developing treatment at a developing solution temperature of 28° C. and a developing time of 30 seconds, followed by the same procedure as mentioned in Example 1 to prepare a printing plate A-4 and a printing plate B-4 (which is a sample of the present invention), respectively. The printing plate A-4 and the printing plate B-4 were both decreased in an amount of aluminum oxide by the developing treatment with the amount of each 0.4 g/m$^2$. With respect to these printing plates, printing was carried out in the same manner as mentioned above and printing endurance was evaluated. As a result, printing endurance of the printing plate A-4 was 30,000 sheets or less but that of the printing plate B-4 was 100,000 sheets or more. Also, in the printing plate B-4, substantially no etch pit was generated.

Example 3

A pH of the developing solution A was adjusted by a phosphoric acid to 12.7 to prepare a developing solution C. By using the thus prepared developing solution C, the lithographic printing materials A and B were subjected to developing treatment at a developing solution temperature of 22° C. and a developing time of 15 seconds, followed by the same procedure as mentioned in Example 1 to prepare a printing plate A-5 and a printing plate B-5 (which is a sample of the present invention), respectively. The printing plate A-5 and the printing plate B-5 were both decreased in an amount of aluminum oxide by the developing treatment with the amount of each 0.5 g/m$^2$. With respect to these printing plates, printing was carried out in the same manner as mentioned above and printing endurance was evaluated. As a result, printing endurance of the printing plate A-5 was 50,000 sheets or less but that of the printing plate B-5 was 100,000 sheets or more. Also, in the printing plate B-5, substantially no etch pit was generated.

Example 4

A pH of the developing solution A was adjusted by a phosphoric acid to 11.9 to prepare a developing solution D. By using the thus prepared developing solution D, the lithographic printing materials A and B were subjected to developing treatment at a developing solution temperature of 25° C. and a developing time of 20 seconds, followed by the same procedure as mentioned in Example 1 to prepare a printing plate A-6 and a printing plate B-6 (which is a sample of the present invention), respectively. The printing plate A-6 and the printing plate B-6 were both decreased in an amount of aluminum oxide by the developing treatment with the amount of each 0.3 g/m$^2$. With respect to these printing plates, printing was carried out in the same manner as mentioned above and printing endurance was evaluated. As a result, printing endurance of the printing plate A-6 was 20,000 sheets or less but that of the printing plate B-6 was 100,000 sheets or more. Also, in the printing plate B-6, substantially no etch pit was generated.

Example 5

By using 30 g of N-methylethanolamine in place of sodium thiosulfate used in the developing solution A prepared in Example 1, a developing solution E a pH of which was adjusted to 12.3 was prepared. By using the thus prepared developing solution E, the lithographic printing materials A and B were subjected to developing treatment at a developing solution temperature of 28° C. and a developing time of 20 seconds, followed by the same procedure as mentioned in Example 1 to prepare a printing plate A-7 and a printing plate B-7 (which is a sample of the present invention), respectively. The printing plate A-7 and the printing plate B-7 were both decreased in an amount of aluminum oxide by the developing treatment with the amount of each 0.4 g/m$^2$. With respect to these printing plates, printing was carried out in the same manner as mentioned above and printing endurance was evaluated. As a result, printing endurance of the printing plate A-7 was 20,000 sheets or less but that of the printing plate B-7 was 100,000 sheets or more. Also, in the printing plate B-7, substantially no etch pit was generated.

Next, in Example 2 and Example 5, the lithographic printing material B was each subjected to running processing (10 m$^2$ was treated per 1 liter of the developing solution) to obtain a printing plate B-8 (after the running processing of Example 2, which is a sample of the present invention) and a printing plate B-9 (after the running processing of Example 5, which is a sample of the present invention), respectively. Printing endurance of the printing plate B-8 was lowered to 80,000 sheets but that of the printing plate B-9 was 100,000 or more and thus it was the same as before the running processing.

Example 6

The same procedure as in Example 1 was repeated except for using, as an aluminum support, a support having an aluminum oxide amount of 3.2 g/m$^2$. The decreased amount of aluminum oxide and the results of printing were the same as those of Example 1.

Example 7

The same procedure as in Example 1 was repeated except for using, as an aluminum support, an aluminum plate treated in the same manner as in Example 1 of U.S. Pat. No. 5,405,730. The decreased amount of aluminum oxide and the results of printing were the same as those of Example 1.

According to the present invention, a developing treatment method which can be carried out at a developing temperature of 20° C. to 30 within a relatively short developing time and gives an aluminum lithographic printing plate having a stable and high printing endurance, preventing from generating etch pits and printing endurance of which is not lowered even after running process of the developing solution can be provided. Also, it is not necessary to use a thiosulfate which has generally been used as a silver halide solvent in the developing solution whereby stabilization of the running processing can be established and problems in controlling a waste solution can be resolved.

What is claimed is:

1. In a process for developing a lithographic printing material having physical development nuclei between an anodized aluminum support and a silver halide emulsion layer containing 95 mole % or more of silver chloride based on the total amount of the silver halide after imagewise exposure, when development of the lithographic printing material is carried out by using a developing solution having a pH of 13.0 at a development temperature of 25° C. and a development time of 40 seconds, a decreased amount of aluminum oxide in the aluminum support is 0.8 g or more per 1 m² of the support, the improvement wherein the process for developing a lithographic printing plate comprises subjecting to development so as to control the decreased amount of said aluminum oxide being 0.6 g or less per 1 m² by combining the development conditions of the pH of the developing solution of 12.7 to 11.5, the temperature of the developing solution of 20 to 30° C., and the development time of 10 to 25 seconds.

2. The process according to claim 1, wherein said silver halide emulsion contains 0.1 to 1.0 mol % of silver iodide.

3. The process according to claim 1, wherein the development processing is carried out under the conditions that an amount of aluminum oxide decreased by dissolution during development becomes 0.5 g or less per 1 m².

4. The process according to claim 1, wherein the lithographic printing plate has an aluminum support having 500 or more of pits with a diameter of 0.03 to 0.30 μm per 100 square μm and an average diameter of the pits of 0.05 to 0.20 μm.

5. The process according to claim 1, wherein the lithographic printing plate has an aluminum support having 1,000 or more of pits with a diameter of 0.03 to 0.30 μm per 100 square um and an average diameter of the pits of 0.05 to 0.15 μm.

6. The process according to claim 1, wherein the lithographic printing plate has an aluminum support in which the total surface area of a depressed area is 50% or more based on the total surface area and the depressed area has a continuous depth of at least 0.5 μm.

7. The process according to claim 1, wherein the developing solution contains a silver halide solvent.

8. The process according to claim 7, wherein the silver halide solvent does not contain a thiosulfate.

9. The process according to claim 8, wherein the silver halide solvent is at least one selected from the group consisting of a sulfite, an iodide, 2-mercaptobenzoic acid or a derivative thereof, a cyclic imide, an alkanol amine, a diamine, a mesoionic compound and a thioether.

10. The process according to claim 9, wherein the mesoionic compound is a compound represented by the formula (I):

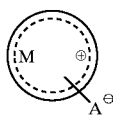

(I)

wherein M represents a heterocyclic compound containing atoms selected from the group consisting of a carbon atom, a nitrogen atom, an oxygen atom, a sulfur atom and selenium atom, and containing at least one of 5-membered or 6-membered ring in the structure; and A⁻ represents —O⁻, —S⁻ or —N⁻—R, where R represents an alkyl group having 6 or less carbon atoms, a cycloalkyl group having 3 to 6 carbon atoms, an alkenyl group having 2 to 6 carbon atoms, an alkynyl group having 2 to 6 carbon atoms, an aralkyl group, an aryl group having 6 to 12 carbon atoms or a heterocyclic ring group having 6 or less carbon atoms.

11. The process according to claim 10, wherein the mesoionic compound is a compound represented by the formula (II) or (III):

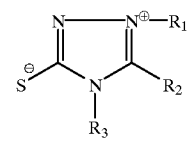

(II)

wherein $R_1$ and $R_3$ may be the same or different and each represents an alkyl group, a cycloalkyl group, an alkenyl group, an alkynyl group, an aralkyl group, an aryl group or a heterocyclic ring group; and $R_2$ represents a hydrogen atom, an alkyl group, a cycloalkyl group, an alkenyl group, an alkynyl group, an aralkyl group, an aryl group or a heterocyclic ring group; or $R_1$ and $R_2$ or $R_2$ and $R_3$ may be bonded to form a ring,

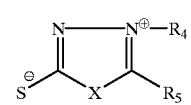

(II)

wherein X represents S or O; $R_4$ and $R_5$ may be the same or different and each represents an alkyl group, a cycloalkyl group, an alkenyl group, an alkynyl group, an aralkyl group, an aryl group, a heterocyclic ring group or a dialkylamino group.

12. The process according to claim 9, wherein the thioether is a compound represented by the following formula (IV):

(IV)

wherein $R_6$ and $R_7$ may be the same or different from each other and each represents an alkyl group having 1 to 5 carbon atoms, or $R_6$ and $R_7$ may be bonded to form a ring, and these alkyl groups may be substituted by an amino group, an amide group, an ammonium group, a hydroxyl group, a sulfo group, a carboxyl group, an aminocarbonyl group or an aminosulfonyl group; and $R_8$ represents an alkylene group in which other divalent group may be interposed between alkylene groups; m is 0 or an integer of 1 to 4, and when m is 2 or more, each $R_8$ may be the same or different from each other.

13. The process according to claim 1, wherein said silver halide emulsion is a negative type emulsion which is not fogged.

14. The process according to claim 1, wherein said silver halide emulsion contains a sensitizing dye having a spectral absorption at 600 to 700 nm for scanning type exposure of a red light source.

* * * * *